(12) United States Patent
Chansungsan

(10) Patent No.: US 7,102,404 B2
(45) Date of Patent: *Sep. 5, 2006

(54) INTERPOLATOR CIRCUIT

(75) Inventor: Chaiyuth Chansungsan, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/173,386

(22) Filed: Jun. 30, 2005

(65) Prior Publication Data

US 2005/0258882 A1   Nov. 24, 2005

Related U.S. Application Data (63) Continuation of application No. 10/435,317, filed on May 9, 2003.

(51) Int. Cl.
 H03L 7/00 (2006.01)
 H03K 5/13 (2006.01)

(52) U.S. Cl. .............. 327/161; 327/237; 327/235; 327/153

(58) Field of Classification Search ............ None
See application file for complete search history.

(56) References Cited

U.S. PATENT DOCUMENTS

| | | | | |
|---|---|---|---|---|
| 4,899,071 A | * | 2/1990 | Morales | 327/277 |
| 4,905,192 A | | 2/1990 | Nogami et al. | 365/200 |
| 5,614,855 A | | 3/1997 | Lee et al. | 327/158 |
| 5,963,074 A | * | 10/1999 | Arkin | 327/276 |
| 6,072,347 A | | 6/2000 | Sim | 327/276 |
| 6,348,826 B1 | * | 2/2002 | Mooney et al. | 327/270 |
| 6,380,783 B1 | | 4/2002 | Chao et al. | 327/258 |
| 6,385,126 B1 | | 5/2002 | Jung et al. | 365/233 |
| 2002/0036525 A1 | | 3/2002 | Hwang | |
| 2003/0038659 A1 | * | 2/2003 | Takahashi et al. | 327/141 |

OTHER PUBLICATIONS

W.J. Dally, "Digital Systems Engineering", Cambridge, pp. 589-591.

* cited by examiner

*Primary Examiner*—Tuan T. Lam
(74) *Attorney, Agent, or Firm*—Philip A. Pedigo (57) ABSTRACT

An improved interpolator includes a replica delay line and an interpolated delay edge generator. The replica delay line provides two replica delay edges to the interpolated delay edge generator. The interpolated delay edge generator selectively generates an interpolated delay edge while maintaining a substantially constant capacitive loading on the two replica delay edges. The replica delay line may comprise a delay cell of four current-starved inverter delay stages or four capacitor-loaded inverter delay stages.

5 Claims, 9 Drawing Sheets

INTERPOLATOR CIRCUIT

RELATED APPLICATIONS

This continuation patent application claims the benefit of priority under 35 U.S.C. §120 of U.S. patent application Ser. No. (10/435,317), titled, "An Interpolator Circuit," filed on May 9, 2003.

TECHNICAL FIELD

Embodiments of the invention generally relate to the field of integrated circuits and in particular to timing-circuits.

BACKGROUND

Computing devices are routinely used to store and process a variety of digitally encoded signals. Typically, there are timing requirements related to processing these signals. These timing requirements often involve generating a periodic clock signal that possesses a specific time relationship with respect to a reference signal. As computing systems become more integrated and operate at higher frequencies, the precision required in generating these periodic clock signals becomes more important.

Figure 1:
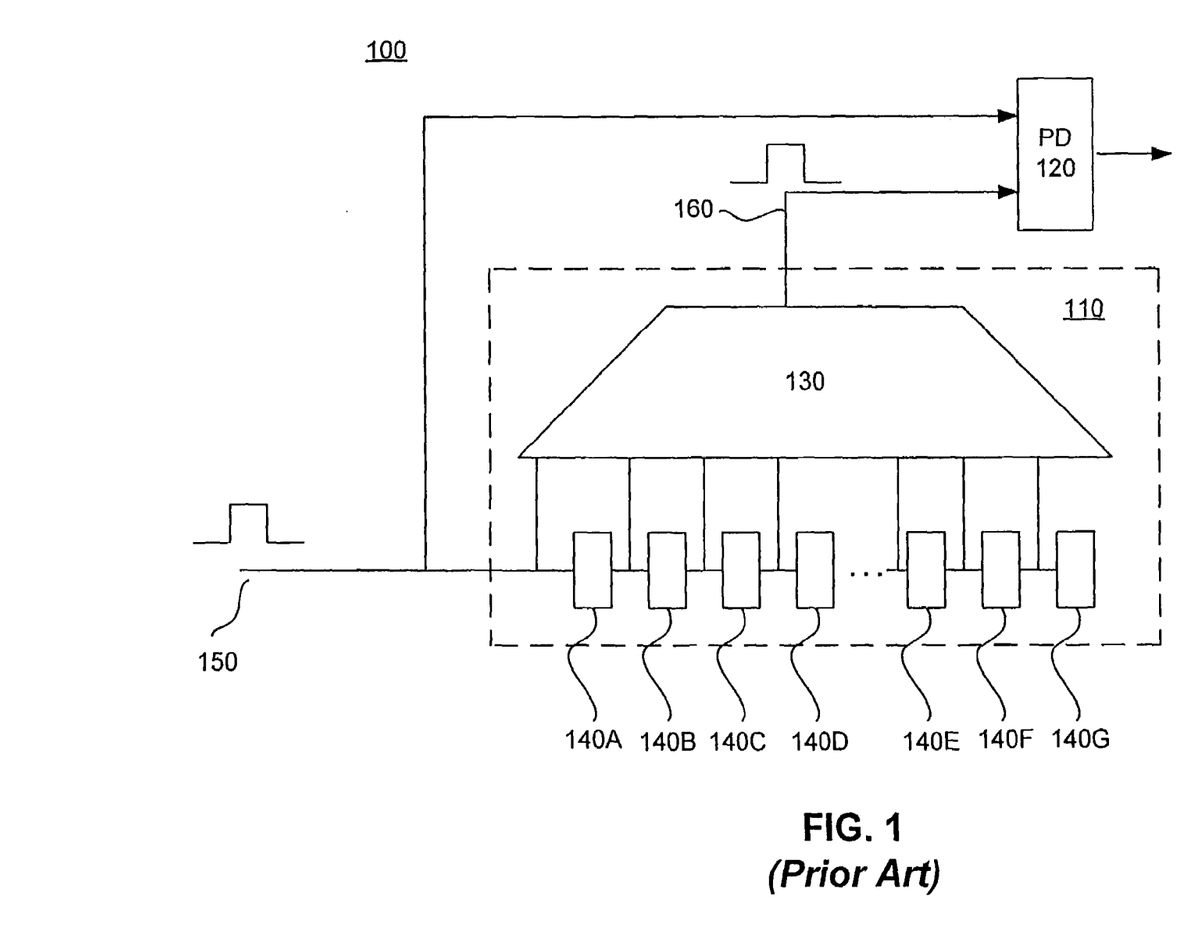
FIG. 1 is a block diagram of conventional delay-locked loop (DLL) 100.

Computing devices typically use conventional delay-locked loops to control the timing of clock signals. FIG. 1 is a block diagram of a conventional delay-locked loop (DLL) 100. Conventional DLL 100 includes delay line 110 and phase detector 120. Delay line 110 has a plurality of delay cells (e.g., delay cells 140A through 140G) and multiplexer 130. A delay cell is an electronic circuit that imparts a delay to signals that pass through the delay cell.

Reference signal 150 provides an input to delay line 110 and phase detector 120. Reference signal 150 is, for example, an internal clock of an integrated circuit. Delay cells 140A through 140G impart a delay time to reference signal 150 as the signal passes through the delay cells. The delay time imparted to reference signal 150 by each delay cell is called a delay period. Typically, the delay period is the same for each delay cell. The output of each delay cell is a signal that is delayed in time and has a significant edge (e.g., rising edge, falling edge, etc.) that is suitable for timing purposes. The term delay edge refers to periodic waveforms having a significant edge (e.g., the outputs of the delay cells).

Delay line 110 provides a delay edge to phase detector 120. Phase detector 120 compares the delay edge to reference signal 150 and provides an output signal that represents the phase difference between the two input signals. The output of phase detector 120 is typically used to generate a voltage-controlled input to the delay cells of delay line 110. The voltage-controlled input determines, in part, which output of the delay cells is selected by multiplexer 130.

Conventional DLL 100 is limited to providing delay edges that are separated by at least one delay period. The ability of conventional DLL 100 to "lock" onto reference signal 150 is limited, therefore, by the width of the delay period. In integrated circuits that are tightly integrated and clocked at high frequencies, conventional DLL 100 may exhibit jitter and slew because the width of the delay period is a relatively coarse increment of change in the amount of delay between delay edges.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to an interpolator for providing interpolated delay edges to delay-locked loop (DLL) circuits. In one embodiment, the interpolator generates an interpolated delay edge whose value is determined by a selection code and is bounded by two replica delay edges. The interpolated delay edge is generated in such a way that a capacitive loading of the replica delay edges is substantially constant for each selected value of the interpolated delay edge, in an embodiment of the invention. The interpolator includes a replica delay line with a delay cell of four delay stages, in an embodiment of the invention.

Figure 2:
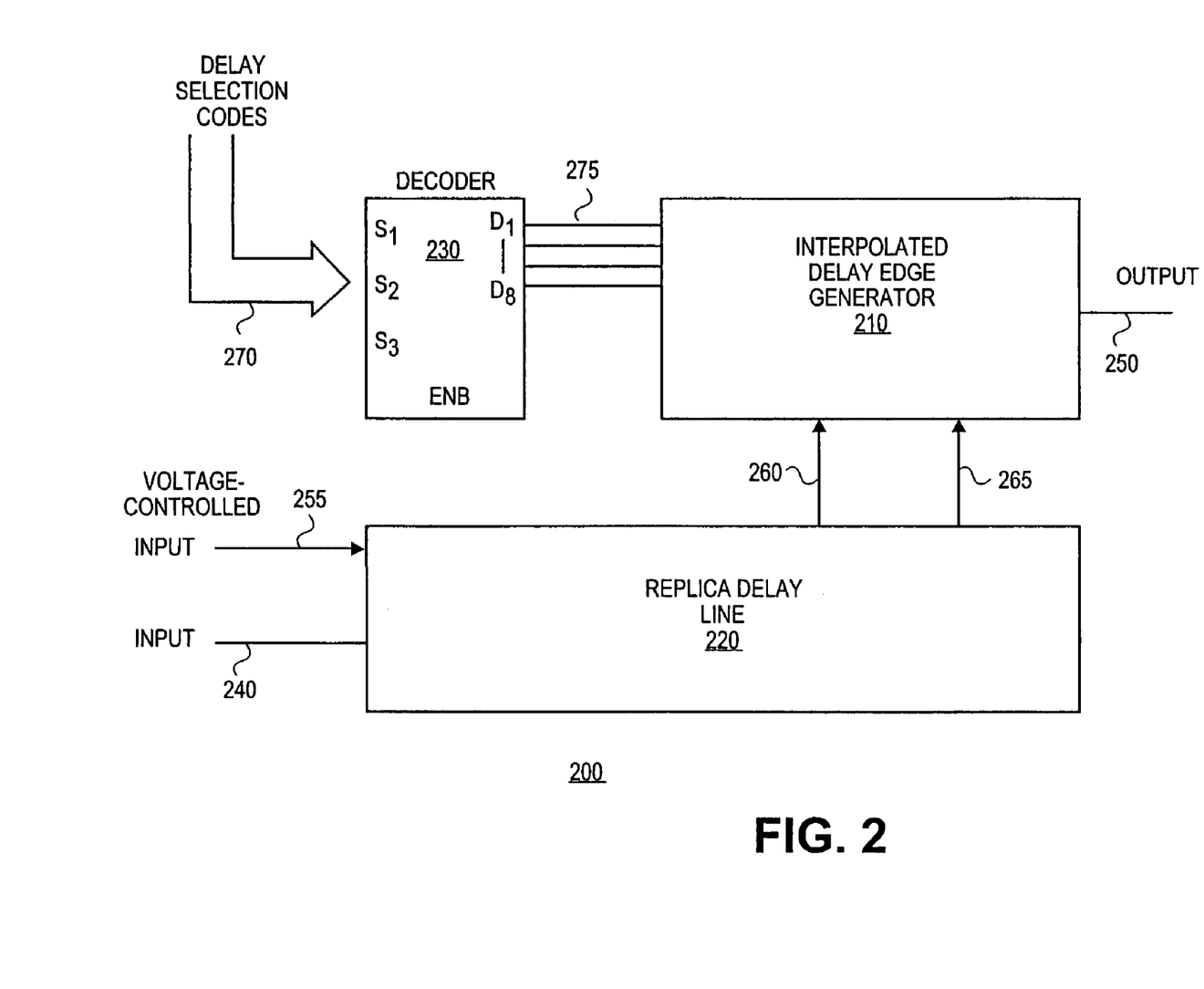
FIG. 2 is a block diagram of selected components of interpolator 200, implemented according to an embodiment of the invention.

FIG. 2 is a block diagram of selected components of interpolator 200, implemented according to an embodiment of the invention. Interpolator 200 includes interpolated delay edge generator 210, replica delay line 220, and decoder 230. As is further explained below, interpolator 200 receives an input signal (e.g., a delay edge from the delay line of a DLL) at reference numeral 240 and provides an interpolated delay edge to another circuit (e.g., the phase detector of a DLL) at reference numeral 250.

In an embodiment of the invention, input 240 is a delay edge generated by the delay line of a DLL (not shown). Replica delay line 220 includes a number of delay stages (not shown), in an embodiment of the invention. Voltage-controlled input 255 provides a bias signal for the delay stages. In an embodiment of the invention, the delay stages within replica delay line 220 and the delay line of the DLL that provides delay edge 240 are biased by the same voltage-controlled input.

The reason replica delay line 220 may be biased the same as the delay line of an associated DLL is to enable replica delay line 220 to replicate the delay period of the DLL. Replicating the delay period of the DLL is further described below with reference to FIG. 5 through FIG. 8. Replica delay line 220 provides replica delay edges 260 and 265 to interpolated delay edge generator 210. In an embodiment of the invention, replica delay edges 260 and 265 define a delay period that replicates the delay period of an associated DLL's delay line.

The function of interpolated delay edge generator 210 is to generate an interpolated delay edge having a delay value that lies within the replicated delay period. In the embodiment illustrated in FIG. 2, the delay value of the interpolated delay edge can be selected by delay selection codes 270. As is further described below with reference to FIG. 3, the interpolated delay edge may be generated in such a way that the rise and fall times of replica delay edges 260 and 265 are not skewed from one selection code to another. The "skewless" nature of replica delay edges 260 and 265 provides a number of important characteristics including uniform delay edge steppings and stable bias control voltages for the delay stages of the DLL providing input 240. In turn, uniform delay edge steppings and stable bias control voltages help reduce the likelihood that a DLL's lock will slip.

Decoder 230 uses delay selection codes 270 to generate selection code inputs 275, in an embodiment of the invention. A person of ordinary skill in the art will appreciate that, representation of delay selection codes 270 and selection code inputs 275 is not limited to three bits and eight bits respectively. In alternative embodiments of the invention, representations of delay selection code 270 and selection code inputs 275 may have a larger number or a smaller number of bits. In the illustrated embodiment, delay selection codes 270 are decoded into eight selection code inputs 275 for an eight-step resolution of available interpolated delay edges between replica delay edge 260 and replica delay edge 265.

Figure 3:
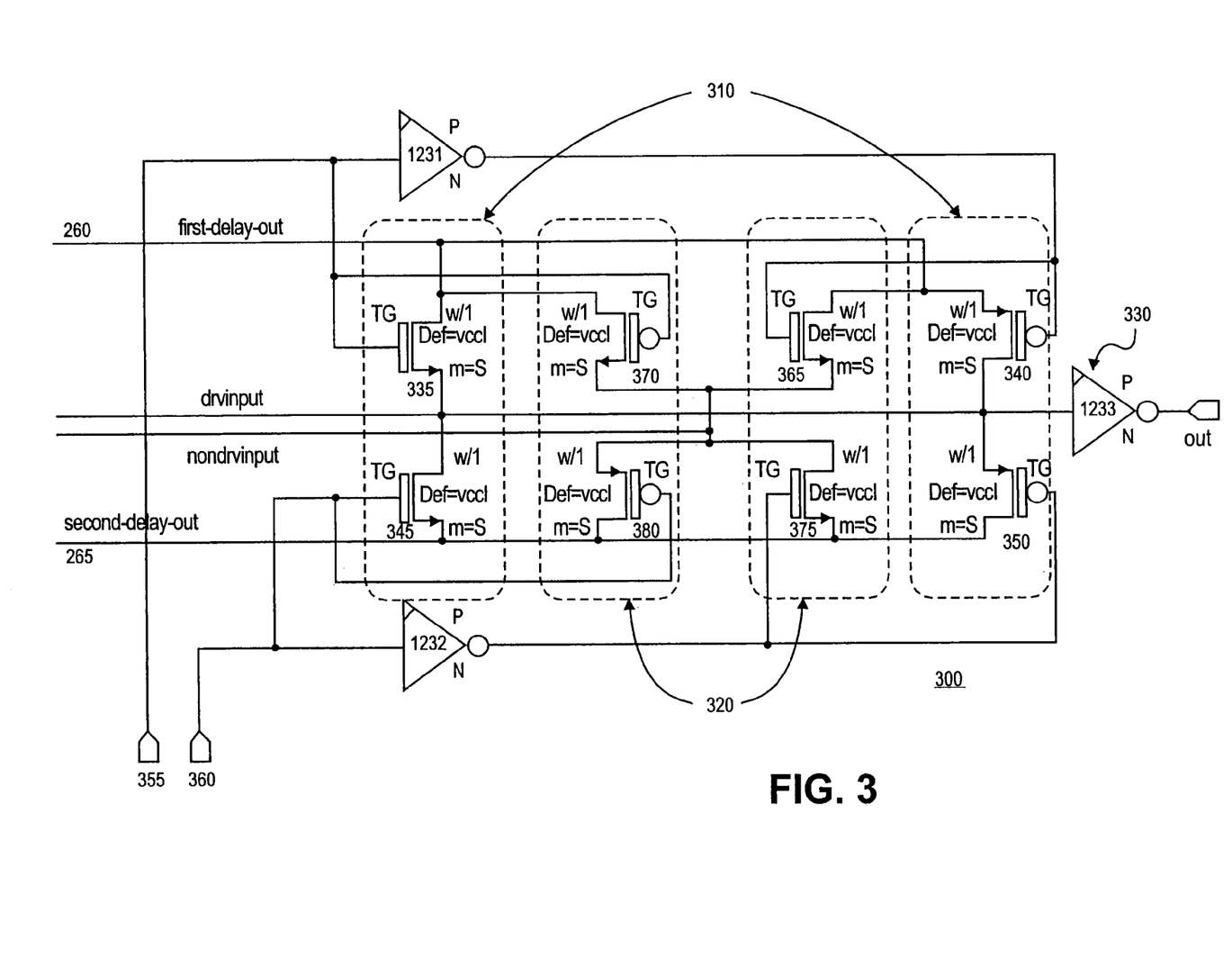
FIG. 3 is a circuit diagram of a section of an interpolated delay edge generator, implemented according to an embodiment of the invention.
Figures 4A, 4B:
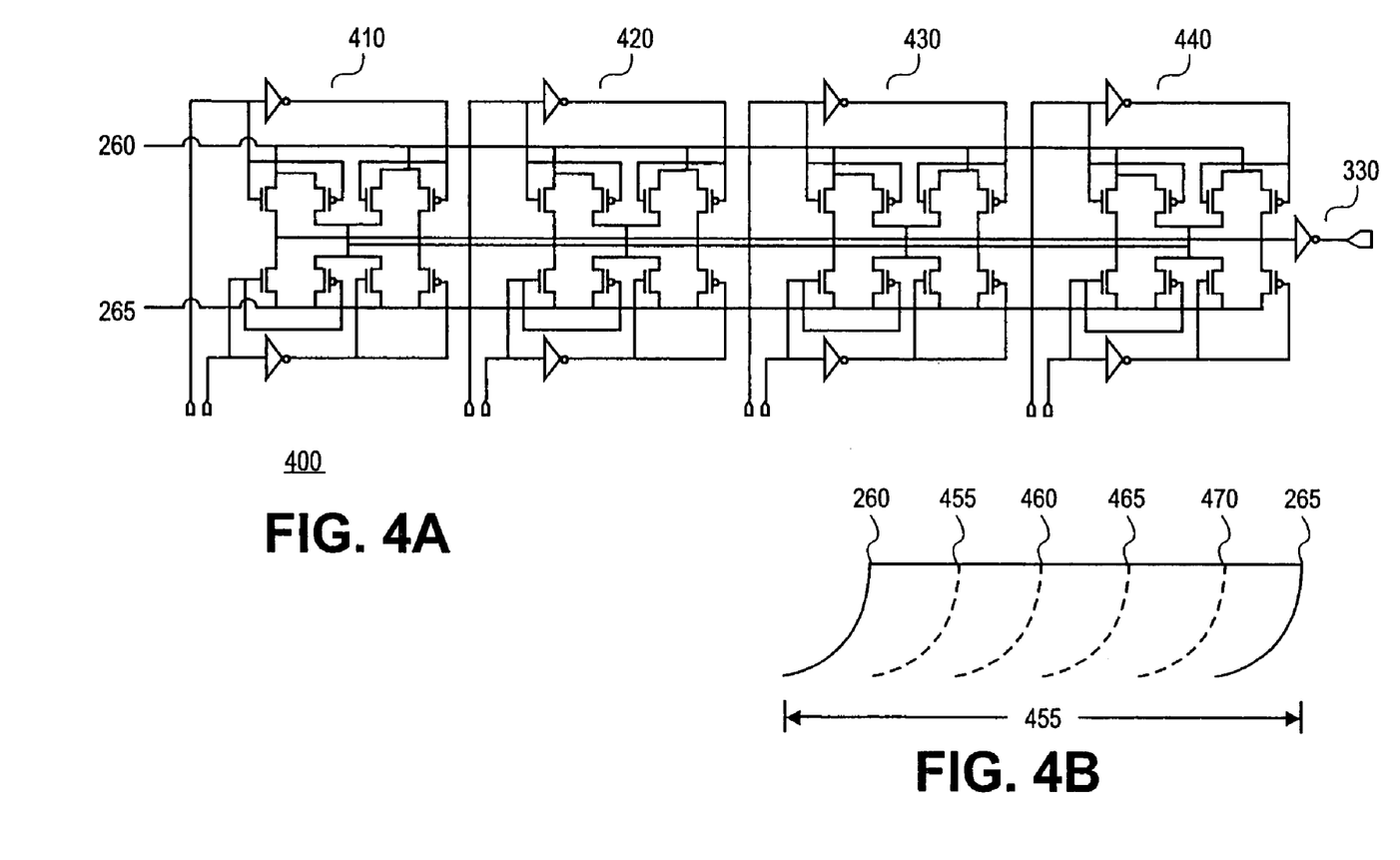
FIG. 4A is a circuit diagram of a four section interpolated delay edge generator, implemented according to an embodiment of the invention.
FIG. 4B illustrates a series of interpolated delay edges produced by interpolated delay edge generator 400, in an embodiment of the invention.

FIG. 3 is a circuit diagram of a section of interpolated delay edge generator 300, implemented according to an embodiment of the invention. Section 300 includes voltage divider 310, replica voltage divider 320, and output inverter 330. As is further discussed below with reference to FIG. 4, four sections are used to form an interpolated delay edge generator, in an embodiment of the invention.

Transistors 335, 340, 345, and 350 form voltage divider 310, in an embodiment of the invention. While the illustrated embodiment of voltage divider 310 is a pass-gate voltage divider, a person of ordinary skill in the art will appreciate that other types of voltage dividers may be used in alternative embodiments of the invention. Voltage divider 310 is enabled by active high control inputs 355 and 360, in an embodiment of the invention. The output of voltage divider 310 drives output inverter 330.

Transistors 365, 370, 375, and 380 form replica voltage divider 320. While the illustrated embodiment of replica voltage divider 320 is a pass-gate voltage divider, replica voltage divider 320 is not required to be a pass-gate voltage divider. Replica delay edges 260 and 265 are provided to both replica voltage divider 320 and voltage divider 310. Active low control inputs 355 and 360 enable replica voltage divider 320, when voltage divider 310 is disabled, in an embodiment of the invention.

Since replica delay edges 260 and 265 are provided to both voltage divider 310 and replica voltage 320, the capacitive loading on replica delay edges 260 and 265 is substantially constant, regardless of whether voltage divider 310 is enabled. Thus, delay edges 260 and 265 are substantially skewless with respect to selection codes 355 and 360, in an embodiment of the invention. The skewless nature of delay edges 260 and 265 enables section 300 to provide uniform delay steppings. Delay-locked loops that employ embodiments of the invention, are less likely to slip due to coupled switching noise because they are provided with uniform delay steppings.

FIG. 4A is a circuit diagram of a four section interpolated delay edge generator 400, implemented according to an embodiment of the invention. Interpolated delay edge generator 400 includes sections 410, 420, 430, and 440, which are substantially the same as section 300, in an embodiment of the invention. Sections 410, 420, 430, and 440 are selectively enabled to provide four different tipping points for output inverter 330. The output of inverter 330 is an interpolated delay edge having a value between replica delay edge 260 and replica delay edge 265.

FIG. 4B illustrates a series of interpolated delay edges produced by interpolated delay edge generator 400, in an embodiment of the invention. Replica delay edges 260 and 265 represent the replica delay edges provided as inputs to interpolated delay edge generator 400. Delay period 445 represents the delay period between replica delay edge 260 and 265. Interpolated delay edges 455, 460, 465, and 470 are within delay period 445. Input selection codes (e.g., input selection codes 275, shown in FIG. 2) selectively enable sections 410, 420, 430, and 440.

The tipping point for output inverter 330 lies between replica delay edges 260 and 265, in the illustrated embodiment of the invention, and varies depending on which section is enabled. Tipping point refers to the input voltage of inverter 330 at which the output voltage moves to a particular value. The output of inverter 330 is a delay edge whose delay time depends on inverter 330's tipping point. Thus, as each section is selectively enabled, a different interpolated delay edge is generated.

Figure 5:
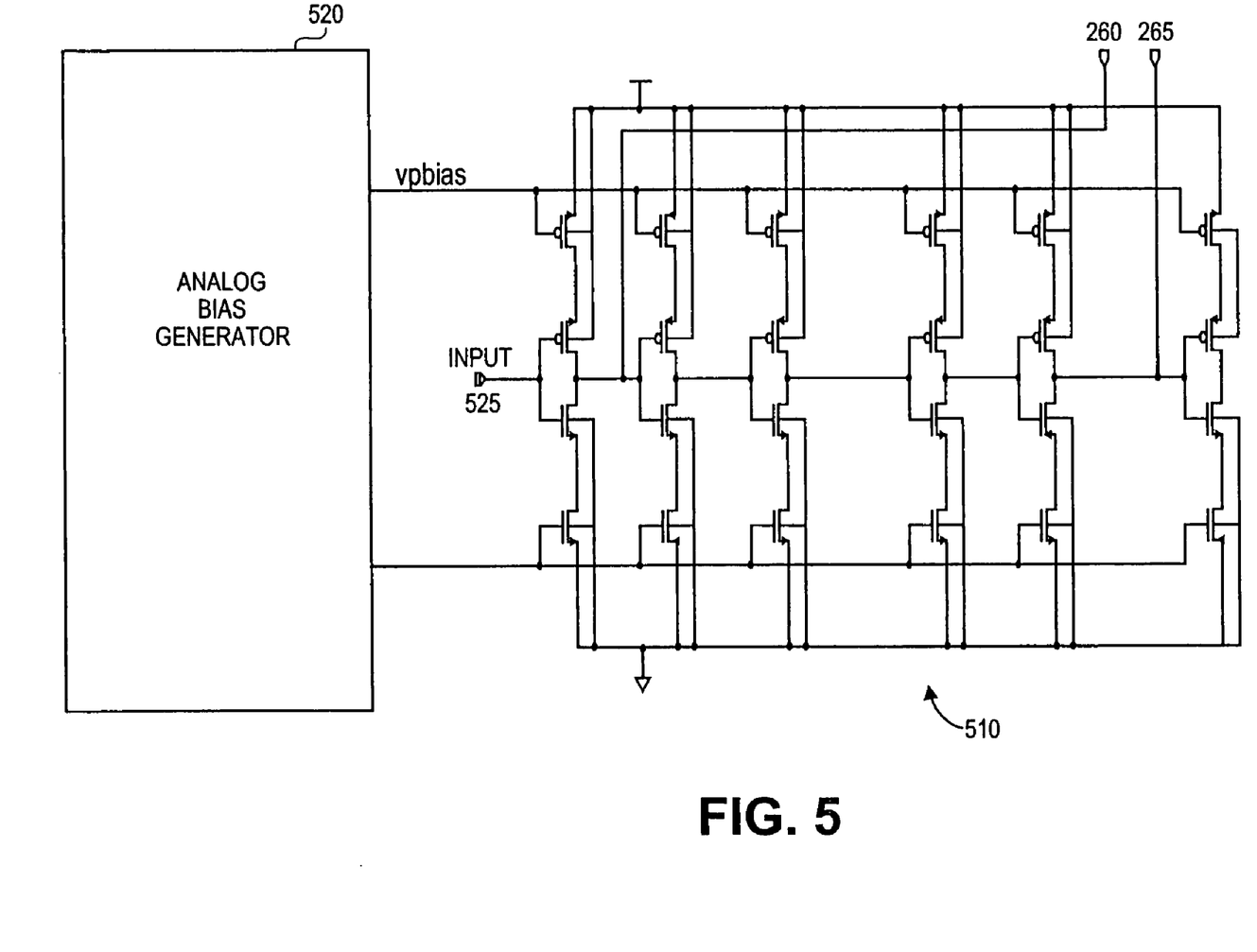
FIG. 5 is a circuit diagram of a current-starved inverter replica delay line with an analog bias generator, implemented according to an embodiment of the invention.

FIG. 5 is a circuit diagram of a current-starved inverter replica delay line 510 with an analog bias generator 520, implemented according to an embodiment of the invention. The outputs of replica delay line 510 are replica delay edges 260 and 265. The inputs to replica delay line 510 include input 525 which, in the illustrated embodiment, is a delay edge provided by the delay line of an associated DLL (not shown). In an embodiment of the invention, the delay line of the associated DLL may be a current-starved inverter delay line similar to replica delay line 510. In such an embodiment, replica delay line 510 reproduces an approximation of the delay period of the DLL's delay line.

Analog bias generator 520 provides Vnbias and Vpbias to replica delay line 510, in the illustrated embodiment of the invention. Vnbias, is provided to analog bias generator 520 from the phase detector of a DLL (not shown), in an embodiment of the invention. In an embodiment of the invention, the delay line of an associated DLL is also biased by Vpbias and Vnbias.

Figure 6:
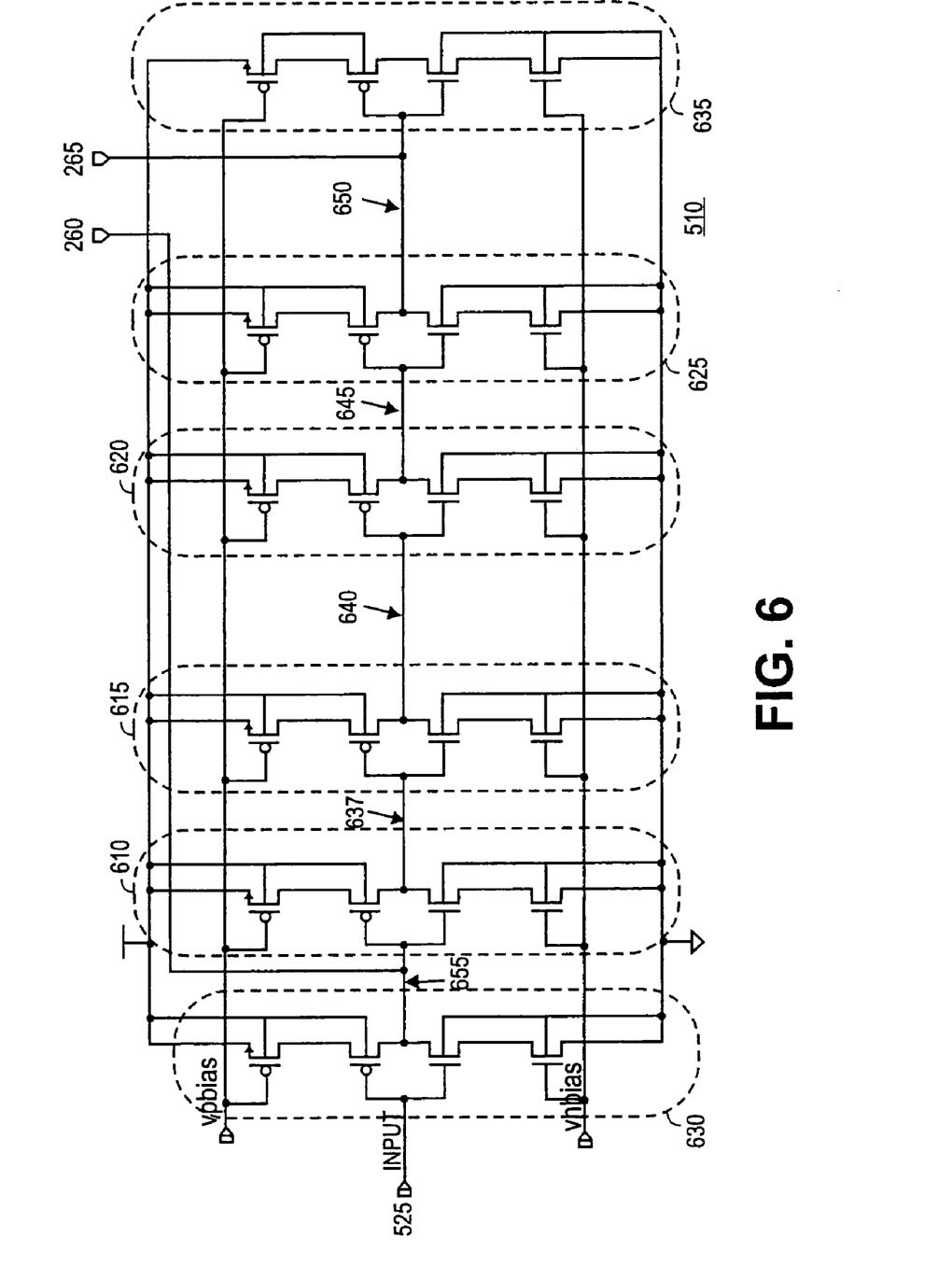
FIG. 6 is a circuit diagram of the current-starved inverter replica delay line shown in FIG. 5, without an analog bias generator.

FIG. 6 is a circuit diagram of current-starved inverter replica delay line 510 shown in FIG. 5. Replica delay line 510 includes delay stages 610, 615, 620, and 625 as well as input buffer 630 and output buffer 635. The function of replica delay line 510 is to receive a delay edge at input 525 and to provide two replica delay edges (e.g., replica delay edges 260 and 265) that replicate the delay period of the received delay edge, in an embodiment of the invention.

In the illustrated embodiment, delay stages 610, 615, 620, and 625 are current-starved inverters that form a delay cell. Current-starved inverters and two-stage current starved inverter delay cells are well known in the art and will not be further described except as to how they relate to embodiments of the invention. For further information on current-starved inverters, see, for example, W. J. Dally, "Digital Systems Engineering," Cambridge, pp. 589–591.

Reference numerals 637, 640, 645, and 650 are, respectively, the outputs of delay stages 610, 615, 620, and 625. In the illustrated embodiment of the invention, the output of each delay stage provides an input for a succeeding delay stage. For example, reference numeral 637 shows that the output of delay stage 610 provides an input to delay stage 615. Replica delay edge 260 is tapped at reference numeral 655, which is also the input to delay stage 610. Replica delay edge 265 is tapped at reference numeral 650, which is the output delay stage 625. The transistors of delay stages 630, 635, 610, 615, 620, and 625 are properly scaled to provide a delay period between replica delay edges 260 and 265 that is a proper approximation to a delay period of an associated DLL's delay line (e.g., delay period 445, shown in FIG. 4B). The novel delay cell of four delay stages of replica delay line 510 provides linearity, uniformity, and monotonicity of the interpolated delay stepping resolution, in an embodiment of the invention.

Input buffer 630 helps to provide a substantially constant capacitive loading on replica delay edge 260 and input 525. Similarly, output buffer 635 helps to provide a substantially constant capacitive loading on replica delay edge 265. In an embodiment of the invention, input buffer 630 and output buffer 635 comprise the same current-starved inverters that are used for delay stages 610, 615, 620, and 625. A person of ordinary skill in the art will appreciate that in alternative embodiments of the invention input buffer 630 and output buffer 635 may be configured differently.

Figure 7:
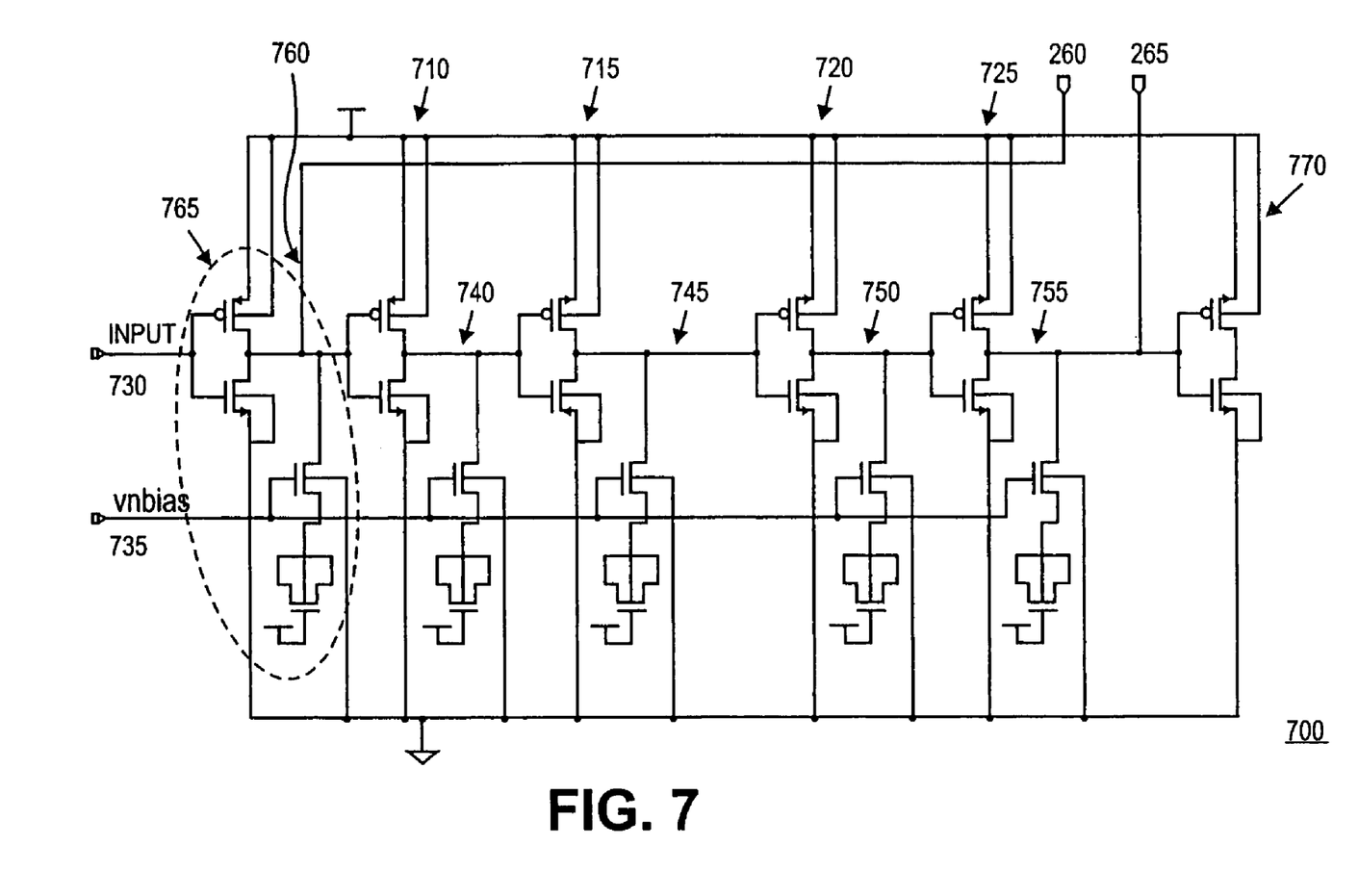
FIG. 7 is a circuit diagram of a capacitor-loaded replica delay line, implemented according to an embodiment of the invention.

FIG. 7 is a circuit diagram of a capacitor-loaded replica delay line 700, implemented according to an embodiment of the invention. Replica delay line 700 includes capacitor-loaded delay stages 710, 715, 720, and 725, as well as input buffer 765, and output buffer 770. Replica delay line 700 provides replica delay edges 260 and 265 as outputs, in an embodiment of the invention. As discussed above with reference to FIGS. 4A and 4B, delay edges 260 and 265 provide a delay period that is interpolated.

The inputs to replica delay line 700 are input 730 and Vnbias 735, in an embodiment of the invention. Input 730, in an embodiment of the invention, is a delay edge from the delay line of an associated DLL (DLL). In such an embodiment, the delay line of the associated DLL may be comprised of capacitor-loaded delay stages similar to delay stages 710, 715, 720, and 725. Vnbias 735 may be generated by the phase detector of the associated DLL and provided to both the DLL's delay line and to replica delay line 700.

In the illustrated embodiment of the invention, delay stages 710, 715, 720, and 725 are capacitor-loaded inverters that form a four-stage delay cell. Capacitor-loaded inverters and two-stage capacitor-loaded inverter delay cells are well known to those of ordinary skill in the art and will not be further described except as to how they relate to embodiments of the invention. For further information on capacitor-loaded inverters see, for example, W. J. Dally, "Digital Systems Engineering," Cambridge, pp. 589–591.

Reference numerals 740, 745, 750, and 755 are, respectively, the outputs of delay stages 710, 715, 720, and 725. In the illustrated embodiment of the invention, the output of each delay stage provides an input for a succeeding delay stage. For example, reference numeral 740 shows that the output of delay stage 710 provides an input to delay stage 715. Replica delay edge 260 is tapped at reference numeral 760, in the illustrated embodiment, which is the input to delay stage 710. Replica delay edge 265 is tapped at reference numeral 755, which is the output of delay stage 260. The transistors of delay stages 710, 715, 720, and 725 and Vnbias are scaled properly to obtain linearity, uniformity, and monotonicity of the interpolated delay stepping resolution, in an embodiment of the invention. The novel four delay stage structure of replica delay line 700 provides a delay period that substantially matches the delay period of an associated DLL, in an embodiment of the invention.

Input buffer 765 helps to provide a substantially constant capacitive loading on replica delay edge 260 and input 730, in an embodiment of the invention. Similarly, output buffer 770 helps to provide a substantially constant capacitive loading on replica delay edge 265. In an embodiment of the invention, input buffer 765 and output buffer 770 comprise capacitor-loaded inverters that are substantially the same as the capacitor-loaded inverters used in delay stages 710, 715, 720, and 725. A person of ordinary skill in the art will appreciate that, in alternative embodiments of the invention, input buffer 765 and output buffer 770 may be configured differently.

Figure 8:
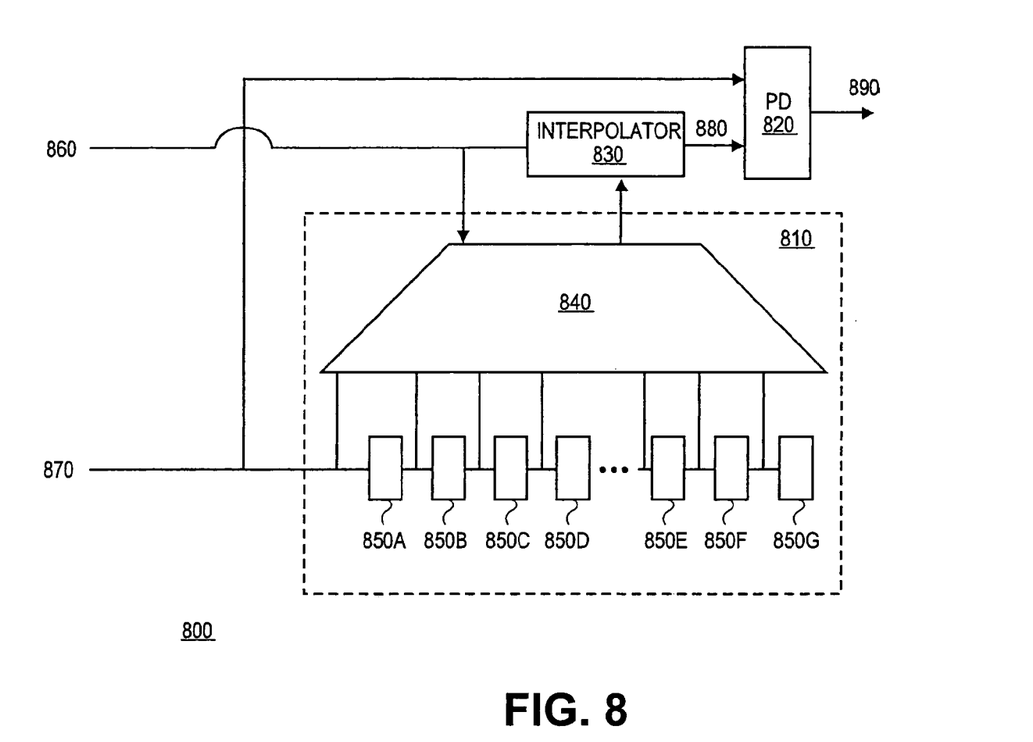
FIG. 8 is a block diagram of DLL 200, implemented according to an embodiment of the invention.

FIG. 8 is a block diagram of delay-locked loop (DLL) 800, implemented according to an embodiment of the invention. DLL 800 includes delay line 810, phase detector 820, and interpolator 830. Delay line 810 includes delay cells 850A through 850G and multiplexer 840, in an embodiment of the invention. Those of ordinary skill in the art will appreciate that DLL 800 may include more components than those shown in FIG. 8. It is not necessary, however, for all of these generally conventional components to be shown in order to disclose an illustrative embodiment of the invention.

In an embodiment of the invention, reference signal 870 provides an input to delay line 810 and phase detector 820. Reference signal 870 may be an internal clock, an external clock, a signal used for debugging (e.g., for input/output alternating current loopback debugging), or any other signal suitable as an input to a delay-locked loop. Delay cells 850A through 850G impart a delay time to reference signal 870 as the signal passes through the delay cells. In an embodiment of the invention, the phase difference imparted to reference signal 870 by each delay cell is a delay period. In some embodiments of the invention, delay cells 850A through 850G comprise current-starved inverter delay cells (e.g., delay stage 610, shown in FIG. 6). In alternative embodiments of the invention, delay cells 850A through 850G comprise capacitor-loaded delay cells (e.g., delay stage 710, shown in FIG. 7). The output of each delay cell is, typically, a signal that is delayed in time with respect to reference signal 870 and that has a significant edge (e.g., a delay edge) suitable for timing and testing purposes. Multiplexer 840 selects one of the delay edges based, at least in part, on select signal 860.

Interpolator 830 receives the selected delay edge, in the illustrated embodiment of the invention. The function of interpolator 830 is to replicate the delay period of delay line 810, based on the received delay edge, and to selectively generate an interpolated delay edge that is within the delay period. In an embodiment of the invention, interpolator 830 uses a replica delay line to replicate the delay period. The replica delay line comprises four current-starved inverter delay stages (e.g., delay stage 610, shown in FIG. 6) to replicate the delay period, in an embodiment of the invention. In alternative embodiments of the invention, the replica delay line comprises four capacitor-loaded inverter delay stages (e.g., delay stage 710, shown in FIG. 7), to replicate the delay period. The replica delay line provides two replica delay edges, which define a delay period to be interpolated.

An interpolated delay edge generator (e.g. interpolated delay edge generator 400, shown in FIG. 4A) receives the two replica delay edges, in an embodiment of the invention.

The interpolated delay edge generator may use a voltage divider circuit to selectively generate a delay edge having a value that is between the two received replica delay edges (e.g., interpolated delay edge 455, shown in FIG. 4B). In the illustrated embodiment, select signal 960 determines, within the range defined by the replica delay edges, the value of the interpolated delay edge.

The interpolated delay edge generator typically comprises a number of stages. The stages may be selectively activated and deactivated to generate the various interpolated delay edges. Each stage comprises a voltage divider and a replica voltage divider (e.g., voltage divider 310 and replica voltage divider 320, shown in FIG. 3), in an embodiment of the invention. In such embodiments, the replica voltage divider is active when its corresponding voltage divider is inactive to maintain a substantially constant capacitive loading on the replica delay edges provided by the replica delay line.

Interpolator 830 provides an interpolated delay edge to phase detector 820, at reference numeral 880, in the illustrated embodiment. Phase detector 820 compares the interpolated delay edge to reference signal 870 and provides an output signal 890 that represents the phase difference between the two input signals. In an embodiment of the invention, output signal 890 is used to generate a voltage-controlled bias signal for delay cells 850A through 850G as well as the replica delay line of interpolator 830.

Figure 9A:
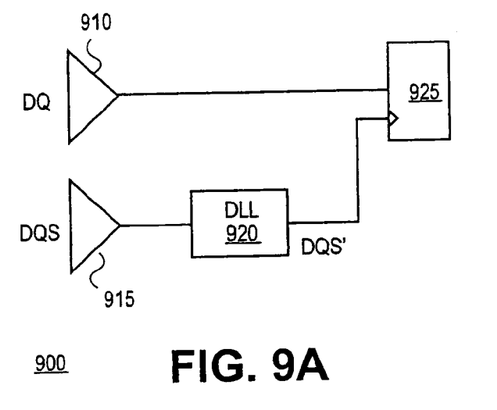
FIG. 9A is a block diagram of timing system 900, implemented according to an embodiment of the invention.

FIG. 9A is a block diagram of a timing system 900, implemented according to an embodiment of the invention. Timing system 900 includes signal sources 910 and 915, latch 925, and delay-locked loop 920, implemented according to an embodiment of the invention. The function of timing system 900 is to provide an adjusted data strobe signal (e.g., DQS') suitable for clocking a data signal at an opportune moment in time.

Signal source 910 provides data signal DQ to latch 925. Data signal DQ may include digitally encoded information provided on a parallel input line, in an embodiment of the invention. Signal source 915 provides strobe signal DQS to delay-locked loop (DLL) 920. DLL 920 receives DQS as a reference signal (e.g., reference signal 870, shown in FIG. 8) and provides an interpolated delay edge (DQS') to clock latch 925.

Figure 9B:
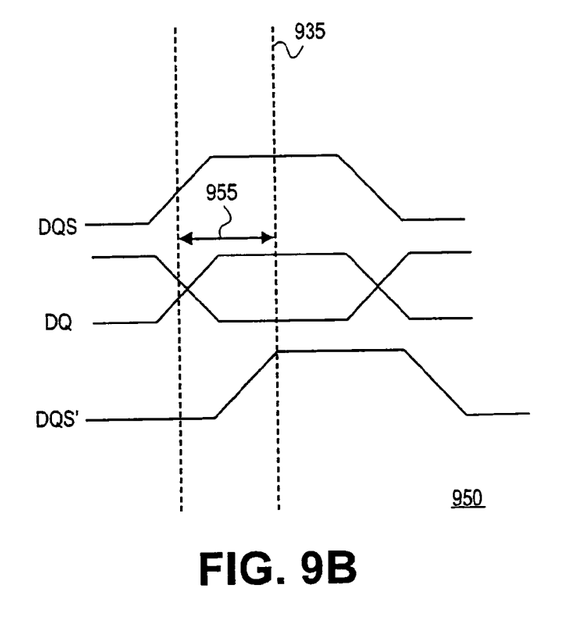
FIG. 9B is a timing diagram illustrating selected signals of timing system 900.

FIG. 9B is a timing diagram illustrating selected signals of timing system 900. Reference numeral 935 illustrates that an opportune time for clocking DQ through latch 925 is approximately midway through the period when DQ is present on the input to latch 935. Strobe signal DQS, however, is in phase with DQ and is not readily suitable for clocking DQ at the proper time. DLL 920 delays DQS by 90 degrees as shown by reference numeral 955. DLL 920 comprises an interpolator implemented according to an embodiment of the invention (e.g., interpolator 830, shown in FIG. 8). Therefore, interpolator 920 provides interpolated delay edges that offer substantially improved resolution in clocking signals over conventional delay-locked loops. The timing signal labeled DQS' illustrates the interpolated delay edge provided by an embodiment of the invention.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

The invention claimed is:

1. An interpolator circuit comprising:
    a replica delay line to receive an input signal and to provide a first replica delay edge and a second replica delay edge based, at least in part, on the input signal; and
    an interpolated delay edge generator to receive the first replica delay edge and the second replica delay edge and to provide an interpolated delay edge selectively having a value between the first replica delay edge the second replica delay edge, wherein a capacitive loading of the first replica delay edge and the second replica delay edge is substantially constant for each selected value of the interpolated delay edge and further wherein the interpolated delay edge generator includes,
    a pass-gate voltage divider having as an input the first replica delay edge and the second replica delay edge and having as an output the interpolated delay edge, the pass-gate voltage divider selectable between an on condition and an off condition, and
    a replica pass-gate voltage divider having as an input the first replica delay edge and the second replica delay edge and selectable between an on condition and an off condition, wherein the replica pass-gate voltage divider is in the on condition when the pass-gate voltage divider is in the off condition to provide a substantially constant capacitive loading on the first replica delay edge and the second replica delay edge.

2. The interpolator circuit of claim 1, wherein the interpolated delay edge generator comprises:
    two or more voltage divider stages, each voltage divider stage including
        a pass-gate voltage divider having as an input the first replica delay edge and the second replica delay edge and having as an output the interpolated delay edge, the pass-gate voltage divider selectable between an on condition and an off condition; and
        a replica pass-gate voltage divider having as an input the first replica delay edge and the second replica delay edge and selectable between an on condition and an off condition, wherein the replica pass-gate voltage divider is in the on condition when the pass-gate voltage divider is in the off condition to provide a substantially constant capacitive loading on the first replica delay edge and the second replica delay edge; and
    an inverter in electrical communication with an output of a final voltage divider stage to provide the interpolated delay edge, wherein a value of the interpolated delay edge is based, at least in part, on which of the two or more voltage divider stages is in the on condition.

3. The interpolator circuit of claim 1, wherein the replica delay line comprises a delay cell of four current-starved inverter delay stages.

4. The interpolator circuit of claim 1, further comprising an analog bias generator.

5. The interpolator circuit of claim 1, wherein the replica delay line comprises a delay cell of four capacitor-loaded inverter delay stages.

* * * * *